(12) United States Patent
Lin et al.

(10) Patent No.: US 12,217,989 B2
(45) Date of Patent: Feb. 4, 2025

(54) SEMICONDUCTOR APPARATUS AND METHOD OF COLLECTING RESIDUES

(71) Applicant: Taiwan Semiconductor Manufacturing Company, Ltd., Hsinchu (TW)

(72) Inventors: Ping-Cheng Lin, Hsinchu (TW); Pin-Yi Hsin, Hsinchu County (TW); Ching Shun Lee, New Taipei (TW); Bo-Han Huang, Hsinchu (TW); Cheng-tsung Tu, MiaoLi County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 758 days.

(21) Appl. No.: 17/395,435

(22) Filed: Aug. 5, 2021

(65) Prior Publication Data

US 2023/0038785 A1 Feb. 9, 2023

(51) Int. Cl.

| | |
|---|---|
| *H01L 21/306* | (2006.01) |
| *C23C 16/00* | (2006.01) |
| *H01J 37/32* | (2006.01) |
| *H01L 21/67* | (2006.01) |
| *H01L 21/673* | (2006.01) |
| *H01L 21/677* | (2006.01) |

(52) U.S. Cl.
CPC .... *H01L 21/6732* (2013.01); *H01J 37/32715* (2013.01); *H01L 21/67115* (2013.01); *H01L 21/67303* (2013.01); *H01L 21/67333* (2013.01); *H01L 21/67757* (2013.01)

(58) Field of Classification Search
CPC ......... H01L 21/67303; H01L 21/67333; H01L 21/67757; H01J 21/6732; H01J 37/32715
See application file for complete search history.

(56) References Cited

U.S. PATENT DOCUMENTS

| | | | | |
|---|---|---|---|---|
| 6,048,154 | A | * 4/2000 | Wytman | H01L 21/67748 414/811 |
| 6,056,123 | A | * 5/2000 | Niemirowski | H01L 21/67306 211/41.18 |
| 2002/0037210 | A1 | * 3/2002 | Matsunaga | C23C 16/54 414/416.08 |
| 2006/0185592 | A1 | * 8/2006 | Matsuura | H01L 21/67757 118/724 |
| 2016/0195331 | A1 | * 7/2016 | Hyon | F27B 5/16 432/125 |
| 2017/0137938 | A1 | * 5/2017 | Hyon | C23C 16/4583 |
| 2018/0277411 | A1 | * 9/2018 | Choi | H01L 21/67712 |

* cited by examiner

*Primary Examiner* — Luz L Alejandro Mulero
(74) *Attorney, Agent, or Firm* — JCIPRNET (57) ABSTRACT

A semiconductor apparatus and a method for collecting residues of curable material are provided. The semiconductor apparatus includes a chamber containing a wafer cassette, and a collecting module disposed in the chamber for collecting residues of curable material in the chamber. The collecting module includes a flow-directing structure disposed below a ceiling of the chamber, a baffle structure disposed below the flow-directing structure, and a tray disposed on the wafer cassette. The flow-directing structure includes a first hollow region, the baffle structure includes a second hollow region, and the tray is moved together with the wafer cassette to pass through the second hollow region of the baffle structure and is positioned to cover the first hollow region of the flow-directing structure.

20 Claims, 11 Drawing Sheets

SEMICONDUCTOR APPARATUS AND METHOD OF COLLECTING RESIDUES

BACKGROUND

Semiconductor processing typically includes numerous steps in order to process a wafer. Polymer-based materials, such as polybenzoxazole (PBO), are often deposited onto a wafer during processing. These polymer-based materials are cured after deposition for many reasons including increasing hardness to improve mechanical strength for higher yields and to better withstand processes (e.g., etching, chemical cleaning, etc.). During the curing, these polymer-based materials may outgas when exposed to heat. When these gas generated species or contaminants are released into the process tool, they may condense on the ceiling of the process tool. If coagulation of condensed polymer drips contacts the wafer, the occurrence of drips may result in undesired wafer defects. Accordingly, there is a need for improved semiconductor apparatus and method which reduce the occurrence of wafer defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the formation of integrated circuit structure, a curing process is usually carried out to solidify a curable dielectric material formed on a semiconductor wafer so as to render a dielectric layer that is tougher, harder, and/or more etch resistant. Examples of the curable dielectric material include, but not limited to, a polybenzoxazoles (PBO) series, a polyimide series, a benzocyclobutenes (BCB) series, an epoxy-based series, or the like. It is noted that the semiconductor wafer mentioned herein is not intended to be limited to any particular type. For example, the curable dielectric material is applied to a surface of the semiconductor wafer and then exposed to thermal energy (e.g., radiation). Examples of the curing application include forming a photoresist (e.g., hard baking), forming an underfill, forming a die attach film (DAF), etc.

In some embodiments, the curing process is performed to drive out the volatile compounds (e.g., moisture or other organic compounds) in the curable dielectric material. During the thermal curing process, gas generated species may diffuse out of the curable dielectric material and release in the chamber. When the operation temperature in the chamber is lowered down, these gas generated species may eventually condense to form residues of curable dielectric material. For example, these residues are formed on the ceiling of the chamber, and gravity may force these residues which gather on the ceiling downward. If drops of these residues contact the semiconductor wafer, the residues contaminate the semiconductor wafer and cause the undesired wafer defects. The apparatus and the method which thoroughly collecting the residues of curable dielectric material are set forth in the accompanying drawings and the descriptions below.

Figure 1:
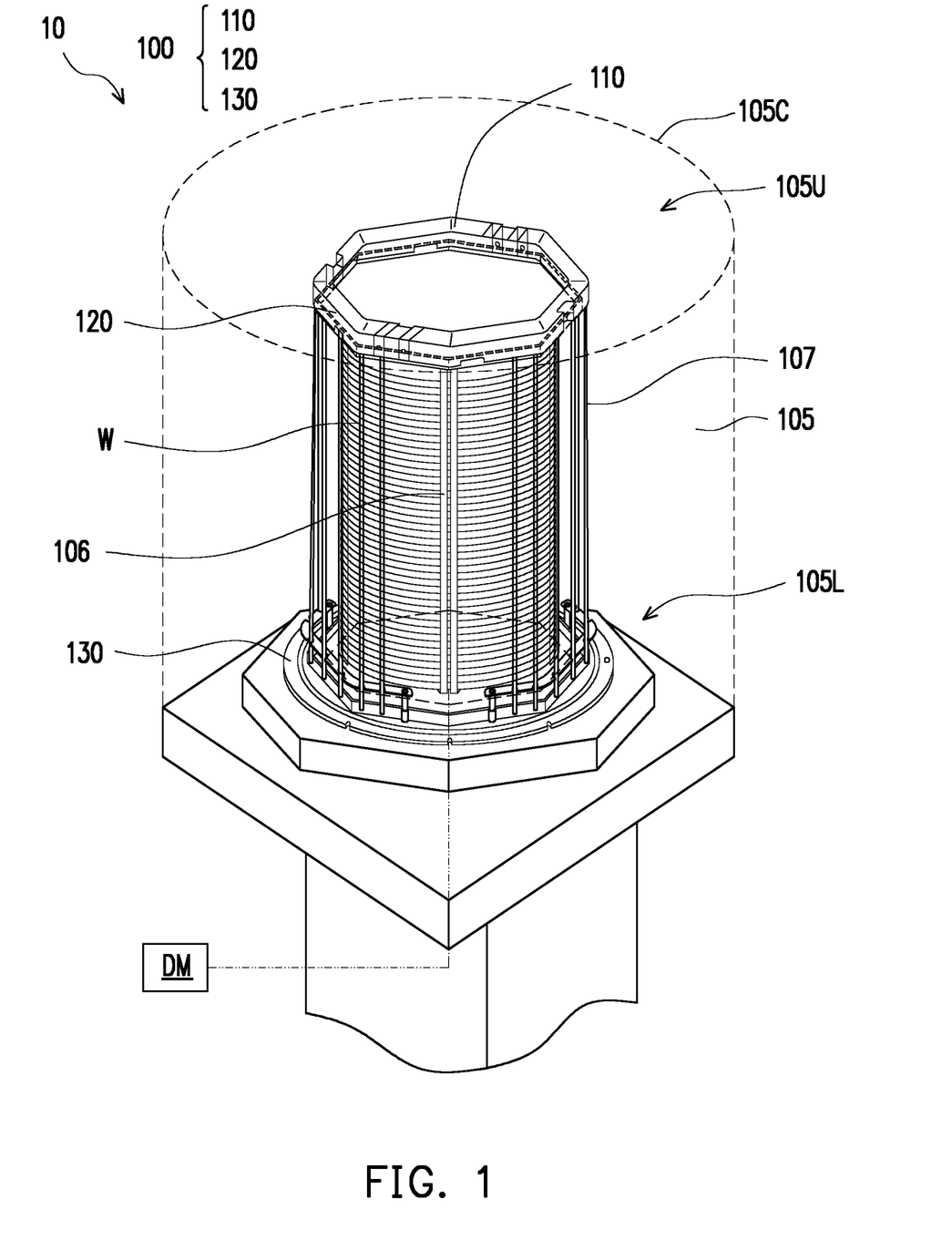
FIG. 1 is a schematic perspective view illustrating a semiconductor apparatus including a collecting module in a door-close state according to some embodiments.
Figure 2:
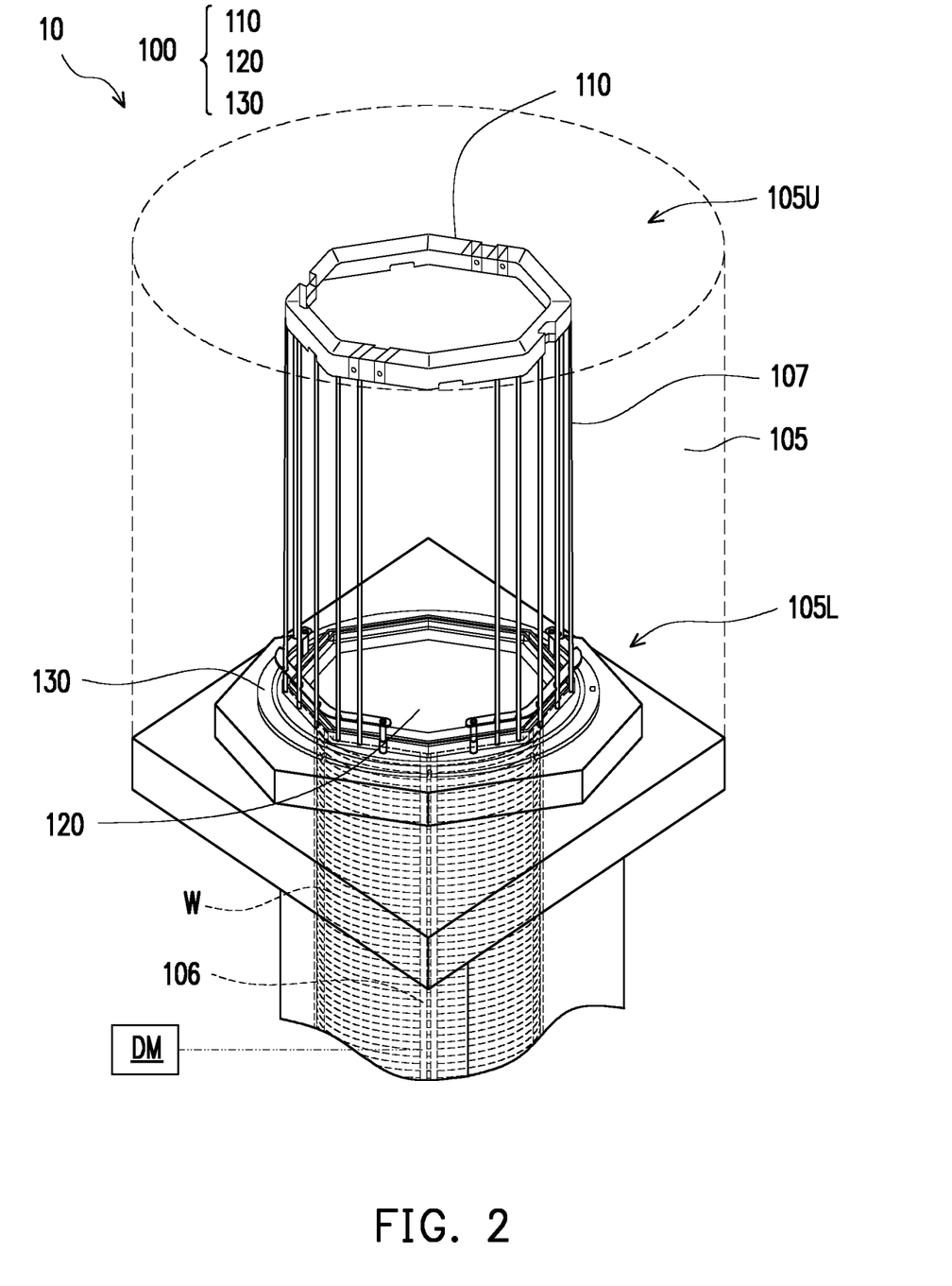
FIG. 2 is a schematic perspective view illustrating a semiconductor apparatus including a collecting module in a door-open state according to some embodiments.

FIG. 1 is a schematic perspective view illustrating a semiconductor apparatus including a collecting module in a door-close state according to some embodiments, and FIG. 2 is a schematic perspective view illustrating a semiconductor apparatus including a collecting module in a door-open state according to some embodiments. Referring to FIG. 1, a semiconductor apparatus 10 is provided. For example, the semiconductor apparatus 10 includes a chamber 105, a wafer cassette 106 movably disposed in the chamber 105 and containing a plurality of semiconductor wafers W, and a collecting module 100 disposed within the chamber 105. The collecting module 100 may be configured to collect residues of curable dielectric material formed in the chamber 105 during and after the curing process. The collecting module 100 may also be configured to prevent the residues of curable dielectric material from dripping onto the semiconductor wafers W. The semiconductor apparatus 10 may include the gas supply manifold 107 extending along the sidewalls of the chamber 105 and configured to introduce gas into the chamber 105. It should be noted that the semiconductor apparatus 10 shown herein is in a simplified manner and may include more components, and the arrangement of the semiconductor apparatus 10 is shown for illustrative purposes only.

In some embodiments, the collecting module 100 includes a flow-directing structure 110 mounted on an upper portion 105U of the chamber 105. For example, the flow-directing structure 110 is disposed below a ceiling 105C of the chamber 105 and configured to direct the residues of curable dielectric material dripping from the ceiling 105C toward elsewhere for collection. In some embodiments, the flow-directing structure 110 is affixed to the chamber 105 using suitable securing mechanism (e.g., fasteners, screws, bolts, pins, rivets, clamps, solders, adhesive, engaging parts, combinations thereof, etc.). In some embodiments, the collecting module 100 includes a tray 120 disposed on the wafer cassette 106. For example, the tray 120 mounted on the wafer cassette 106 is configured to shield the wafer cassette 106 in order to prevent the residues of curable dielectric material from contaminating the semiconductor wafers W. In some embodiments, the tray 120 is positioned below the flow-directing structure 110 to collect the residues of curable dielectric material dripping from the central opening of the flow-directing structure 110. The flow-directing structure 110 and the tray 120 may be any suitable material that can withstand the chemistries and thermal energy involved in the process. For example, the materials of the flow-directing structure 110 and the tray 120 may be steel, stainless steel, aluminum, metal alloys, composite materials, combinations of these, and/or like.

In some embodiments, the collecting module 100 includes a baffle structure 130 mounted on a lower portion 105L of the chamber 105. The baffle structure 130 may be placed near the exit of the chamber 105. For example, the baffle structure 130 is disposed below the flow-directing structure 110 and configured to collect the residues of curable dielectric material dripping from the edges of the flow-directing structure 110. In some embodiments, the baffle structure 130 is affixed to the chamber 105 using suitable securing mechanism (e.g., fasteners, screws, bolts, pins, rivets, clamps, solders, adhesive, engaging parts, combinations thereof, etc.). The baffle structure 130 may be any suitable material that can withstand the chemistries and thermal energy involved in the process. The details of the collecting module 100 will be respectively described later in accompanying with FIGS. 3-8. In some embodiments, the gas supply manifold 107 is affixed to the flow-directing structure 110 and the baffle structure 130. For example, the gas supply manifold 107 extends vertically between the flow-directing structure 110 and the baffle structure 130, and the wafer cassette 106 is surrounded by the gas supply manifold 107. Although the gas supply manifold 107 may have other arrangement.

Referring to FIGS. 1-2, in some embodiments, the wafer cassette 106 driven by the driving mechanism DM is made to perform reciprocating movements (e.g., raising up and lowering down). The tray 120 mounted on the wafer cassette 106 may be moved together with the wafer cassette 106. For example, the wafer cassette 106 is mounted on a moving platform (not shown), and the driving mechanism DM is coupled to the moving platform to drive the wafer cassette 106 moving up/down. The driving mechanism DM including a controller may interface with the moving platform for executing a set of programmable instructions. The controller of the driving mechanism DM may issue control signals for operating the motions of the moving platform, so that the wafer cassette 106 mounted on the moving platform may move to a desired position. It should be noted that the driving mechanism DM in FIGS. 1-2 is for illustrative purposes only. For example, the driving mechanism DM includes motor drivers, electric motors, gear motors, drive shafts, actuators, or any suitable means that is configured to change the positon of the wafer cassette 106 in the chamber 105.

In some embodiments, during the thermal curing process or when the thermal curing process is substantially going to be complete, the door of the semiconductor apparatus 10 is close, and the chamber 105 may be viewed as in a close state. As shown in FIG. 1, when the chamber 105 is in the close state, the semiconductor wafers W held by the wafer cassette 106 is located within the chamber 105. The tray 120 secured onto the top of the wafer cassette 106 may be located between the flow-directing structure 110 and the baffle structure 130. For example, the tray 120 is located at a position immediately below the flow-directing structure 110 for collecting the residues of curable dielectric material flowing along the flow-directing structure 110. The details of collecting the residues of curable dielectric material using the collecting module 100 in the door-close state will be described in accompanying with FIG. 11.

In some embodiments, after the thermal curing process is finished, the door of the semiconductor apparatus 10 is open to unload the semiconductor wafers W that have been processed, and the chamber 105 is viewed as in an open state. As shown in FIG. 2, when the chamber 105 is in the open state, the wafer cassette 106 carrying the semiconductor wafers W that have been processed may be lowered down away from the flow-directing structure 110. Subsequently, the semiconductor wafers W that have been proceed may be unloaded using, for example, a robotic arm (not shown) or any suitable unloading means. When the wafer cassette 106 is positioned at the unloaded position (e.g., shown in FIG. 2), the tray 120 mounted on the wafer cassette 106 is also moved downwardly to be positioned at the lower portion 105L of the chamber 105. In some embodiments, the tray 120 is positioned within the baffle structure 130, and the wafer cassette 106 is located below the baffle structure 130. The details of collecting the residues of curable dielectric material using the collecting module 100 in the door-open state will be described in accompanying with FIG. 12.

Figure 3:
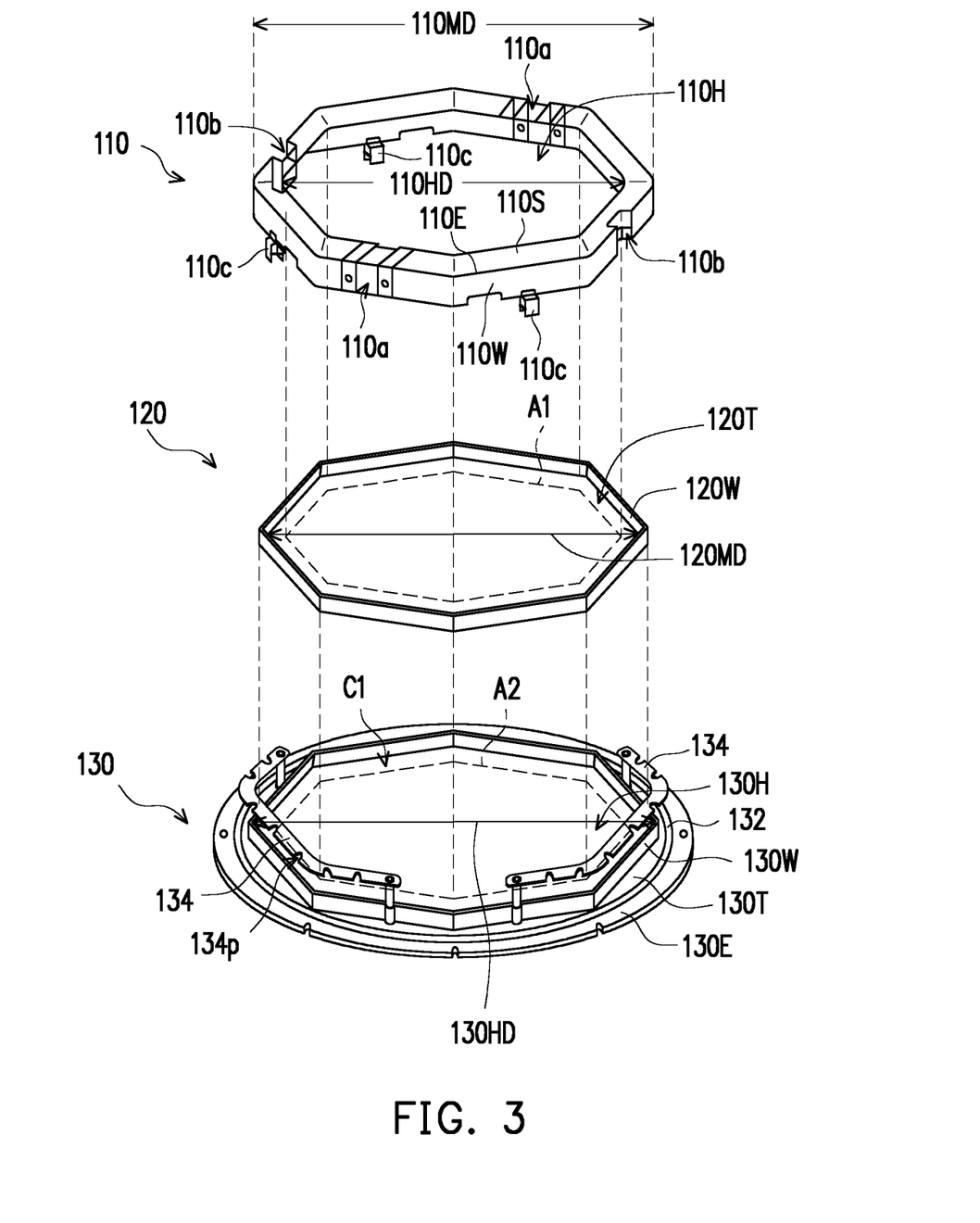
FIG. 3 is a schematic perspective view illustrating a collecting module including a flow-directing structure, a tray, and a baffle structure according to some embodiments.
Figure 4:
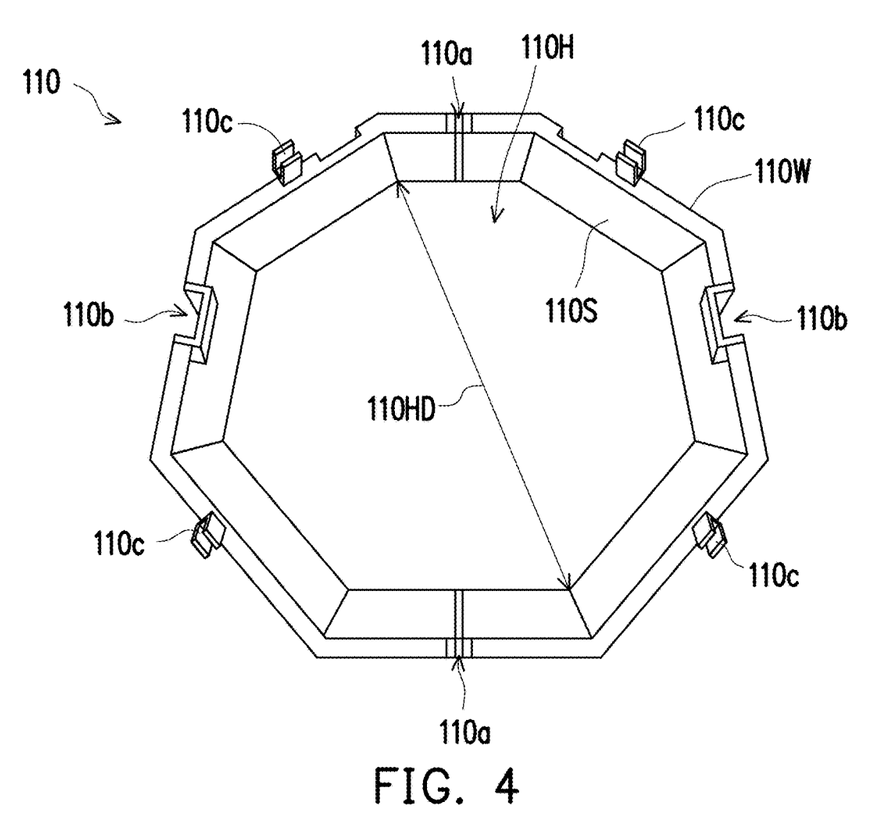
FIG. 4 is a schematic perspective bottom-up view illustrating a flow-directing structure according to some embodiments.
Figure 5:
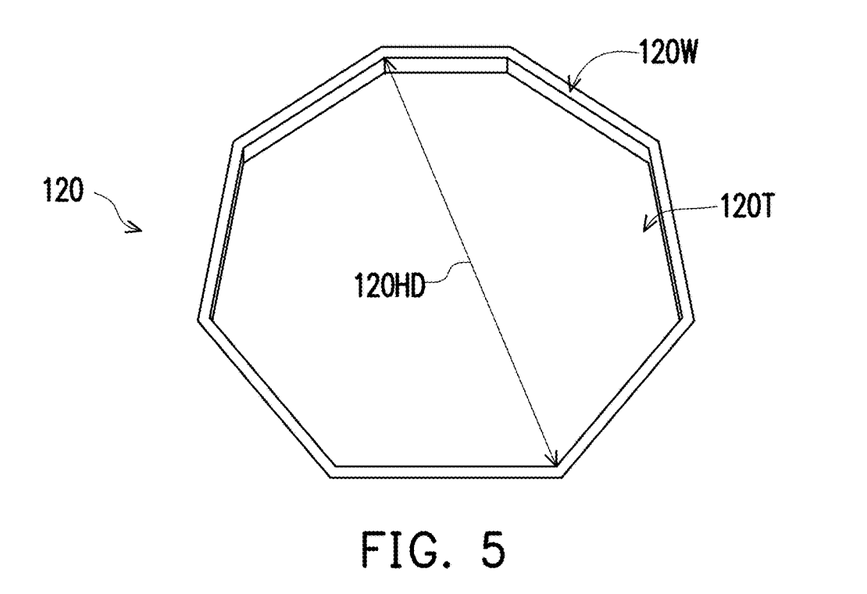
FIG. 5 is a schematic perspective top-down view illustrating a tray according to some embodiments.
Figure 6:
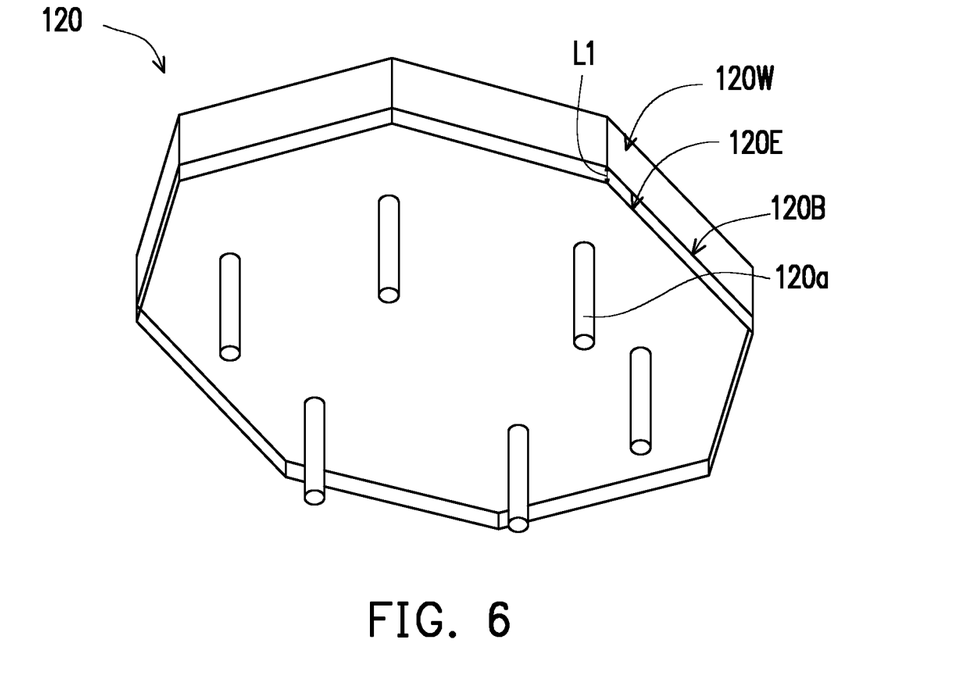
FIG. 6 is a schematic perspective bottom view illustrating a tray according to some embodiments.
Figure 7:
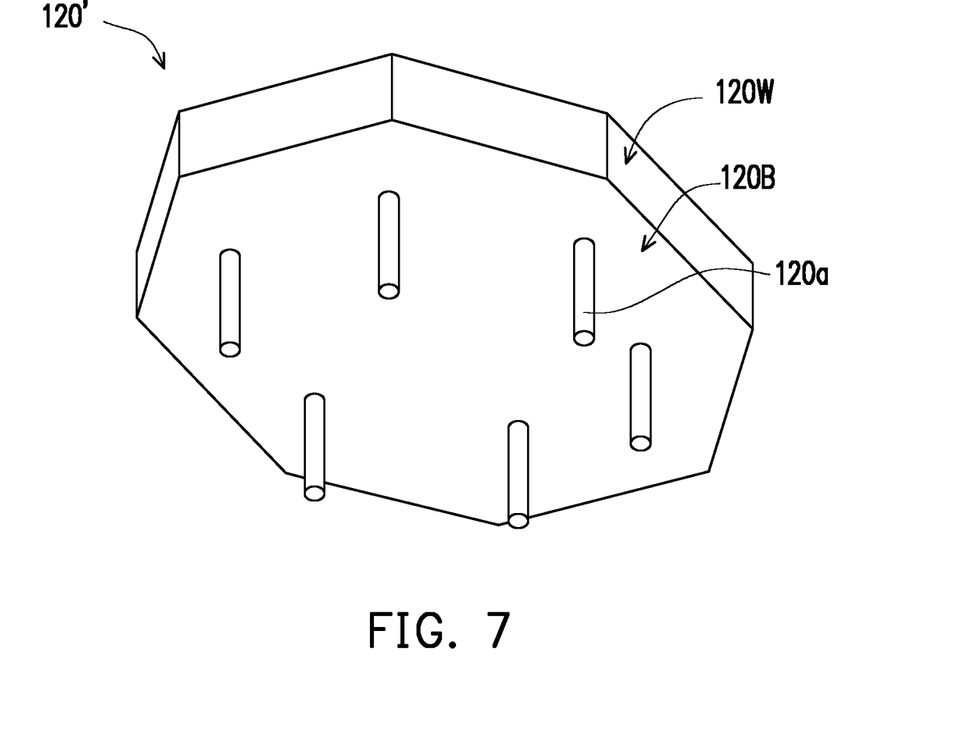
FIG. 7 is a schematic perspective bottom view illustrating a variation of the tray according to some embodiments.
Figure 8:
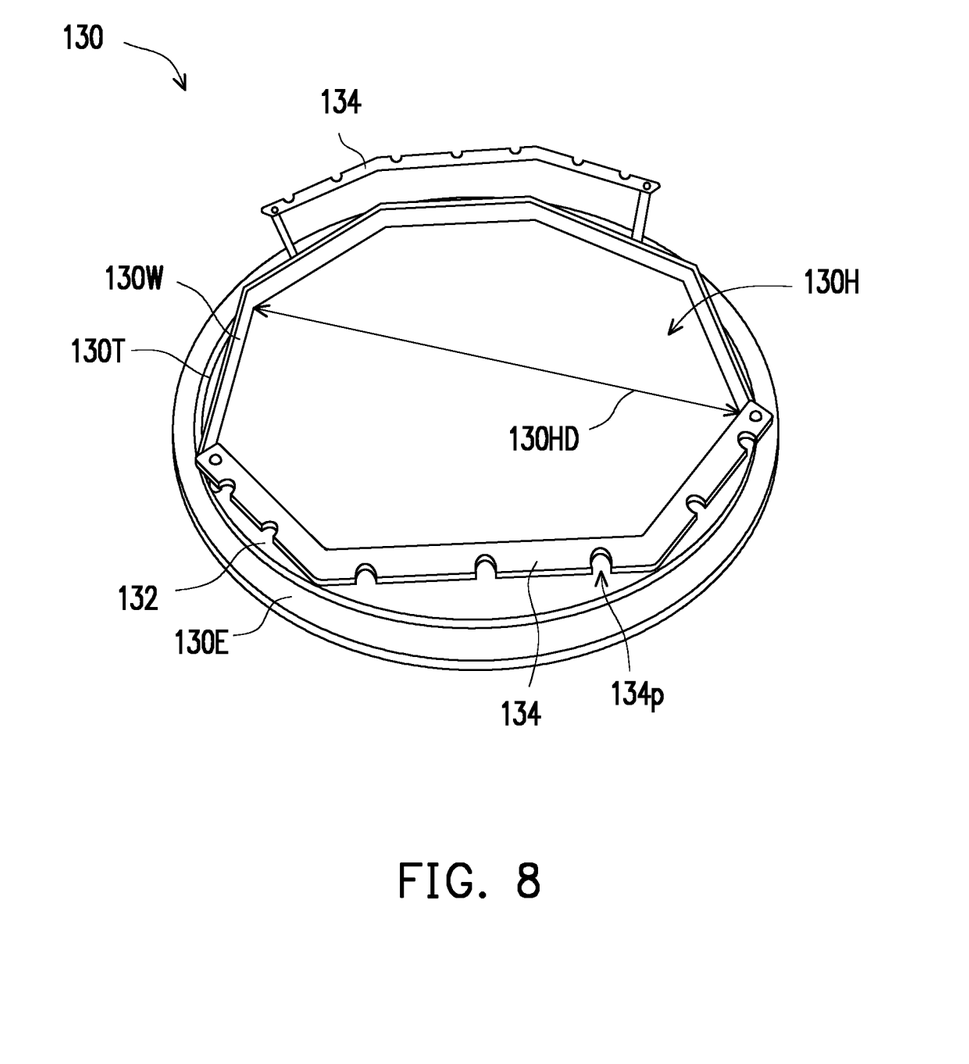
FIG. 8 is a schematic perspective top-down view illustrating a baffle structure according to some embodiments.

FIG. 3 is a schematic perspective view illustrating a collecting module including a flow-directing structure, a tray, and a baffle structure according to some embodiments, FIG. 4 is a schematic perspective bottom-up view illustrating a flow-directing structure according to some embodiments, FIG. 5 is a schematic perspective top-down view illustrating a tray according to some embodiments, FIGS. 6-7 are schematic perspective bottom view illustrating variations of a tray according to some embodiments, and FIG. 8 is a schematic perspective top-down view illustrating a baffle structure according to some embodiments. Unless specified otherwise, like reference numbers are used to designate like elements throughout the drawings.

Referring to FIGS. 3-4, the flow-directing structure 110 of the collecting module 100 may include a hollow region 110H. In some embodiments, in the top-down (or bottom-up) view, the flow-directing structure 110 is formed in a closed-loop having a central opening (i.e. 110H). The hollow region 110H of the flow-directing structure 110 may have an octagonal contour. Alternatively, the contour of the hollow region 110H may be of a circular, a square, a rectangular, an oval, a polygonal, or any other irregular shape. In some embodiments, the flow-directing structure 110 includes an outer sidewall 110W and a slanted surface 110S connected to the outer sidewall 110W. The outer sidewall 110W may be a substantially vertical sidewall, and the slanted surface 110S may have a slope toward the hollow region 110H for directing the residues of curable dielectric material toward the hollow region 110H. The boundary of the slanted surface 110S may define or form the contour of the hollow region 110H, as seen from the top-down (or bottom-up) view. For example, the slanted surface 110S is tilt from the top edge 110E toward the hollow region 110H. In some embodiments, the included angle (e.g., $\theta$ labeled in FIGS. 11-12) between the slanted surface 110S and the outer sidewall 110W is an acute angle. For example, the included angle (e.g., $\theta$ labeled in FIGS. 11-12) is in a range of approximately 20-80 degrees. Although other value may be applicable depending on design and process requirements.

Still referring to FIGS. 3-4 and with reference to FIG. 1, the flow-directing structure 110 may include engaging parts for coupling the chamber 105 and the gas supply manifold 107. In some embodiments, the flow-directing structure 110 is mounted on the chamber 105 using the first engaging parts 110a (e.g., bolts, screws, nuts, securing tabs, combinations thereof, etc.). In some embodiments, the gas supply manifold 107 is engaged with the flow-directing structure 110 through the second engaging parts including the recess 110b and the securing tabs 110c. The details of the attachment of the gas supply manifold will be described in accompanying with FIG. 9.

Referring to FIGS. 3 and 5, the tray 120 of the collecting module 100 is disposed below the flow-directing structure 110. The tray 120 may be solid and have a collecting surface 120T for carrying the residues of curable dielectric material which flow toward the hollow region 110H of the flow-directing structure 110. The tray 120 may be of an octagonal shape. Alternatively, the tray 120 may be of a circular, a square, a rectangular, an oval, a polygonal, or any other irregular shape. In some embodiments, the shape of the tray 120 is substantially complementary to the contour of the hollow region 110H of the flow-directing structure 110. For example, the contour of the tray 120 and the contour of the hollow region 110H of the flow-directing structure 110 are of the octagonal shape when being seen from the top-down (or bottom-up) view.

Figure 10:
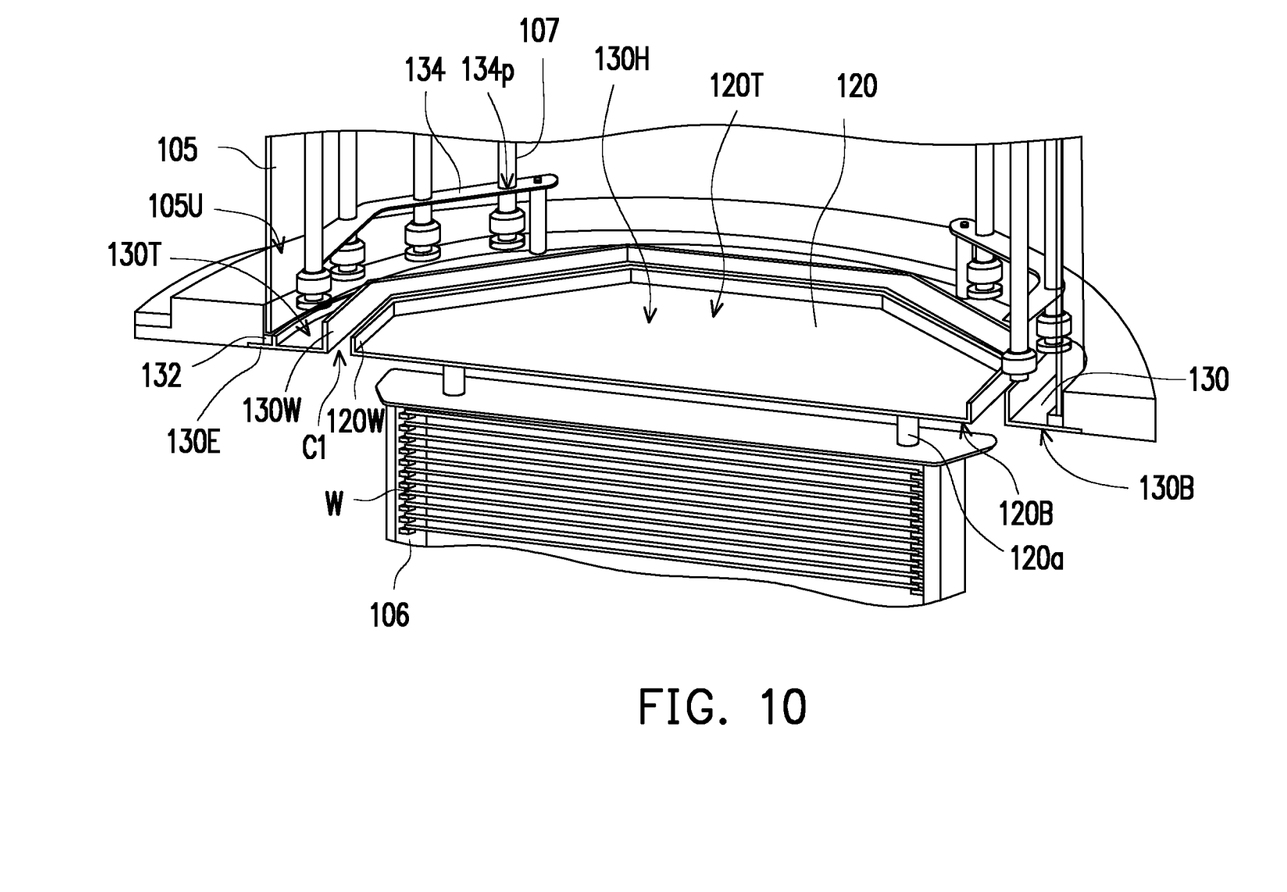
FIG. 10 is a schematic perspective cross-sectional view illustrating a baffle structure and a tray mounted on a wafer cassette according to some embodiments.

In some embodiments, a maximum lateral dimension 120MD of the collecting surface 120T of the tray 120 is substantially greater than a maximum lateral dimension 110HD of the hollow region 110H of the flow-directing structure 110. In some embodiments, the flow-directing structure 110 has a maximum lateral dimension 110MD measured between outer sidewalls 110W, and the maximum lateral dimension 120MD of the collecting surface 120t of the tray 120 is substantially less than the maximum lateral dimension 110MD of the flow-directing structure 110. For example, the sidewall 120W of the tray 120 is located between the endpoints of the slanted surface 110S and the outer sidewall 110W of the flow-directing structure 110 (e.g., as shown in FIG. 10). In some embodiments in which the flow-directing structure 110 is provided in a shape of octagon, the maximum lateral dimension 110HD of the hollow region 110H and the maximum lateral dimension 110MD are respectively referred to as the longest diagonal line of the octagonal shape. Similarly, when the collecting surface 120t of the tray 120 is of the octagonal shape, the maximum lateral dimension 120MD may be the longest diagonal line of the octagonal shape. In some embodiments, the tray 120 and the hollow region 110H of the flow-directing structure 110 are of different shapes as long as the tray 120 can entirely cover the hollow region 110H of the flow-directing structure 110. Again, the shapes provided herein are merely for illustrative purposes and may vary depending on requirements.

In some embodiments, the surface area of the collecting surface 120t of the tray 120 is greater than the size of the hollow region 110H of the flow-directing structure 110. For example, the area A1 illustrated in the dashed lines on the collecting surface 120t of the tray 120 is the area of the orthogonal projection of the hollow region 110H of the flow-directing structure 110. By configuring the collecting surface 120t of the tray 120 larger than the hollow region 110H of the flow-directing structure 110, the residues of curable dielectric material directed toward the hollow region 110H may be fully collected by the tray 120.

Still referring to FIG. 3 and with reference to FIGS. 1 and 6, the tray 120 includes a bottom surface 120B opposite to the collecting surface 120T and facing the wafer cassette 106. In some embodiments, at least one engaging part 120a is disposed on the bottom surface 120B for mounting onto the top of the wafer cassette 106. For example, the engaging parts 120a include fasteners, screws, bolts, pins, rivets, clamps, combinations of these, etc. It should be understood that the engaging parts 120a are given for illustrative purposes, and various numbers, shapes, and configurations are within the contemplated scope of the disclosure. In some embodiments, the tray 120 includes a sidewall extension 120E connected to the sidewall 120W and extending around the bottom surface 120B. In some embodiments, the sidewall extension and the sidewall may be integratedly formed and collectively viewed as the overall sidewall, and the bottom surface 120B may be located between the top endpoint and the bottom endpoint of the overall sidewall.

In some embodiments, the sidewall extension 120E facilitates shielding the wafer cassette 106 and preventing dripping of the residues from contacting the semiconductor wafer W. For example, the residues of curable dielectric material dripping on the sidewall 120W of the tray 120 may fall along the sidewall extension 120E without dripping onto the wafer cassette 106 and semiconductor wafers W. The length L1 of the sidewall extension 120E measured between the intersection of the bottom surface 120B and the endpoint of the sidewall extension 120E is greater than zero. In some embodiments, the length L1 of the sidewall extension 120E is less than 5 mm. For example, the length L1 is in a range of about 1-5 mm. Although other value may be applicable depending on the requirements.

Referring to FIG. 7 and with reference to FIG. 6, the sidewall extension may be omitted, in accordance with some embodiments. As shown in FIG. 7, the tray 120' includes the bottom surface 120B and the sidewall 120W connected to the bottom surface 120B, where the bottom surface 120B is at the bottom endpoint of the sidewall 120W. For example, the tray 120' has the optimal dimension to fully cover the wafer cassette 106 and prevent the residues of curable dielectric material from contaminating the semiconductor wafers W, and thus the sidewall extension may not be necessary.

Referring back to FIG. 3 and with reference to FIG. 8, the baffle structure 130 of the collecting module 100 is disposed below the flow-directing structure 110. For example, the baffle structure 130 includes a hollow region 130H. In some embodiments, in the top-down view, the baffle structure 130 is formed in a closed-loop having a central opening (i.e. 130H). The hollow region 130H of the baffle structure 130 may be of an octagonal shape. Alternatively, the hollow region 130H of the baffle structure 130 may be of a circular, a square, a rectangular, an oval, a polygonal, or any other irregular shape. The hollow region 130H of the baffle structure 130 may be wider than the tray 120 to allow the wafer cassette 106 and the tray 120 mounted on the wafer cassette 106 to pass through the hollow region 130H of the baffle structure 130.

In some embodiments, a maximum lateral dimension 130HD of the hollow region 130H of the baffle structure 130 is substantially greater than the maximum lateral dimension 120MD of the collecting surface 120T of the tray 120. In some embodiments in which the hollow region 130H of the baffle structure 130 has an octagonal contour, the maximum lateral dimension 130HD of the hollow region 110H and the maximum lateral dimension 110MD are respectively referred to as the longest diagonal line of the octagonal shape. For example, the area A2 illustrated in the dashed lines in the hollow region 130H of the baffle structure 130 is the area of the orthogonal projection of the collecting surface 120T of the tray 120. As shown in FIG. 3, the area A2 is completely within the hollow region 130H of the baffle structure 130. A clearance C1 is between the tray 120 and the boundary of the hollow region 130H, where the clearance C1 is non-zero. In some embodiments, the shape of the tray 120 is substantially complementary to that of the hollow region 130H of the baffle structure 130. Alternatively, the hollow region 130H of the baffle structure 130 and the tray 120 may not have matching shapes as long as the tray 120 and the wafer cassette 106 disposed below the tray 120 can pass through the hollow region 130H of the baffle structure 130 without being interfered.

Referring back to FIG. 3 and with reference to FIGS. 1 and 8, the baffle structure 130 includes a sidewall 130W encircling the hollow region 130H, a collecting surface 130T connected to the sidewall 130W, and a bottom extension 130E surrounding the collecting surface 130T and configured to be mounted on the chamber 105. For example, the residues of curable dielectric material dripping along the outer sidewall 110W of the flow-directing structure 110 may fall onto the collecting surface 130T of the baffle structure 130. The bottom extension 130E may not be coplanar with the collecting surface 130T. For example, the collecting surface 130T is higher than the bottom extension 130E. In some embodiments, the baffle structure 130 includes a sealing member 132 interposed between the collecting surface 130T and the bottom extension 130E. The sealing member 132 may be disposed on the bottom extension 130E to encircle the collecting surface 130T. For example, the sealing member 132 is an O-ring, or other sealing or compressible member, that contacts the chamber 105 and the bottom extension 130E to sufficiently create an airtight seal. By configuring the sealing member 132, the residues of curable dielectric material may not escape from the gap between the chamber 105 and the baffle structure 130.

Still referring to FIGS. 3 and 8 and with reference to FIG. 1, a bracket 134 may be mounted on the collecting surface 130T of the baffle structure 130. Alternatively, the brackets 134 may be mounted on the bottom extension 130E of the baffle structure 130. For example, the brackets 134 are provided for attachment of the gas supply manifold 107. In some embodiments, the gas supply manifold 107 is abutted against the brackets 134 through the openings 134p. The details of the attachment of the gas supply manifold will be described in accompanying with FIG. 10. It should be noted that a pair of brackets is illustrated as an example, and the number and the configuration of the brackets construe no limitation in the disclosure. Alternatively, the brackets are omitted.

Figure 9:
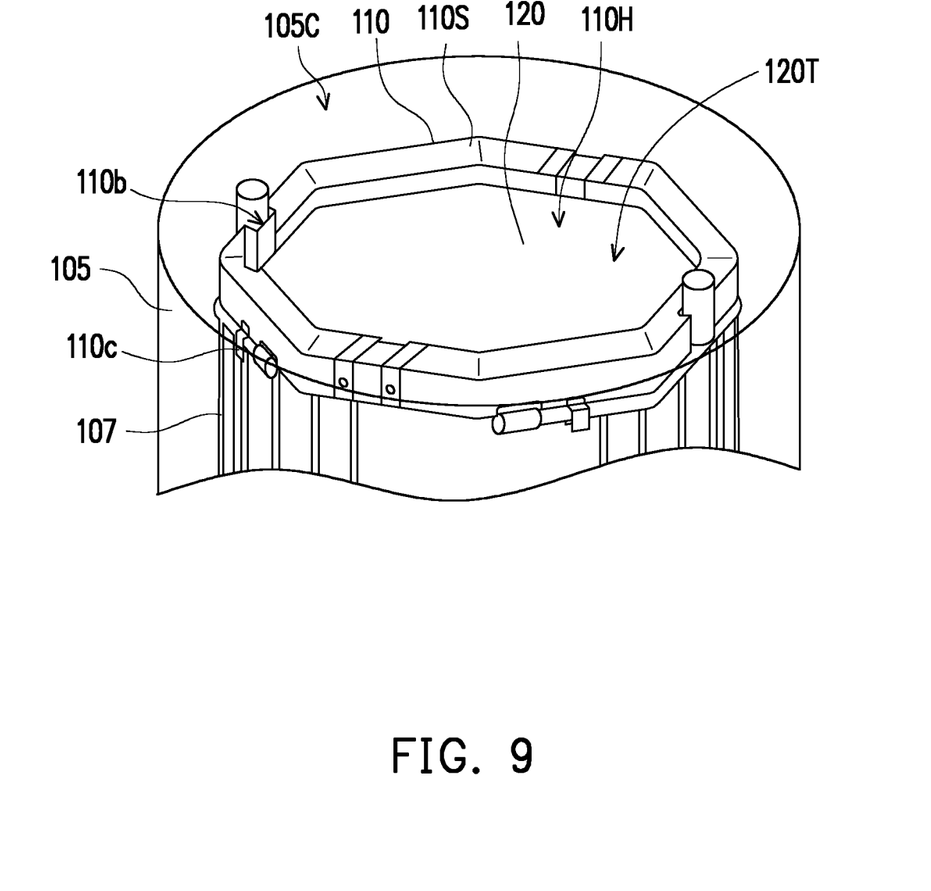
FIG. 9 is a schematic perspective view illustrating a flow-directing structure and a tray at an upper portion of a chamber according to some embodiments.

FIG. 9 is a schematic perspective view illustrating a flow-directing structure and a tray at an upper portion of a chamber according to some embodiments. The structure shown in FIG. 9 may be in the door-close state, and unless specified otherwise, like reference numbers are used to designate like elements throughout the drawings.

Referring to FIG. 9 and with reference to FIGS. 1 and 3, the flow-directing structure 110 is disposed below the ceiling 105C of the chamber 105. The gas supply manifold 107 is engaged with the flow-directing structure 110 through the second engaging parts. For example, a portion of the gas supply manifold 107 is abutted against the flow-directing structure 110 through the recess 110b, and another portion of the gas supply manifold 107 is affixed onto the securing tabs 110c. In some embodiments, the tray 120 is right below the flow-directing structure 110 to entirely cover the hollow region 110H of the flow-directing structure 110. In this manner, the residues of curable dielectric material flowing on the slanted surface 110S may be directed toward the hollow region 110H and then deposited on the collecting surface 120T of the tray 120.

FIG. 10 is a schematic perspective cross-sectional view illustrating a baffle structure and a tray mounted on a wafer cassette according to some embodiments. FIG. 10 illustrate a cross section of the structure to show the location relation between the baffle structure and the tray in the door-open state. Unless specified otherwise, like reference numbers are used to designate like elements throughout the drawings.

Referring to FIG. 10 and with reference to FIGS. 2-3, the baffle structure 130 is assembled onto the chamber 105 using any suitable engaging mechanism. The sealing member 132 is interposed between the chamber wall and the bottom extension 130E to facilitate sealing the chamber 105 and preventing the residues from release out of the chamber 105. The gas supply manifold 107 may be abutted against the brackets 134 through the openings 134p. The tray 120 may be mounted on the top of the wafer cassette 106 using the engaging parts 120a. The height of the respective engaging part 120a may vary depending on requirements and construes no limitation in the disclosure.

In the door-open state, the tray 120 is positioned within the hollow region 130H of the baffle structure 130 and surrounded by the sidewall 130W of the baffle structure 130. In some embodiments, the bottom surface 120B of the tray 120 is substantially leveled with the bottom surface 130B of the baffle structure 130. Alternatively, the bottom surfaces of the tray and the baffle structure may not be aligned. For example, the tray may be positioned to be higher (or lower) than the bottom surface of the baffle structure. For example, the sidewall 120W of the tray 120 is spatially separated from the sidewall 130W of the baffle structure 130, and the clearance C1 is formed therebetween. For example, the shortest lateral distance between the sidewall 120W of the tray 120 and the sidewall 130W of the baffle structure 130 (e.g., the clearance) is in a range of about 1 mm to about 30 mm. It should be noted that the scope of embodiments is not limited to any particular range of clearance C1.

Figure 11:
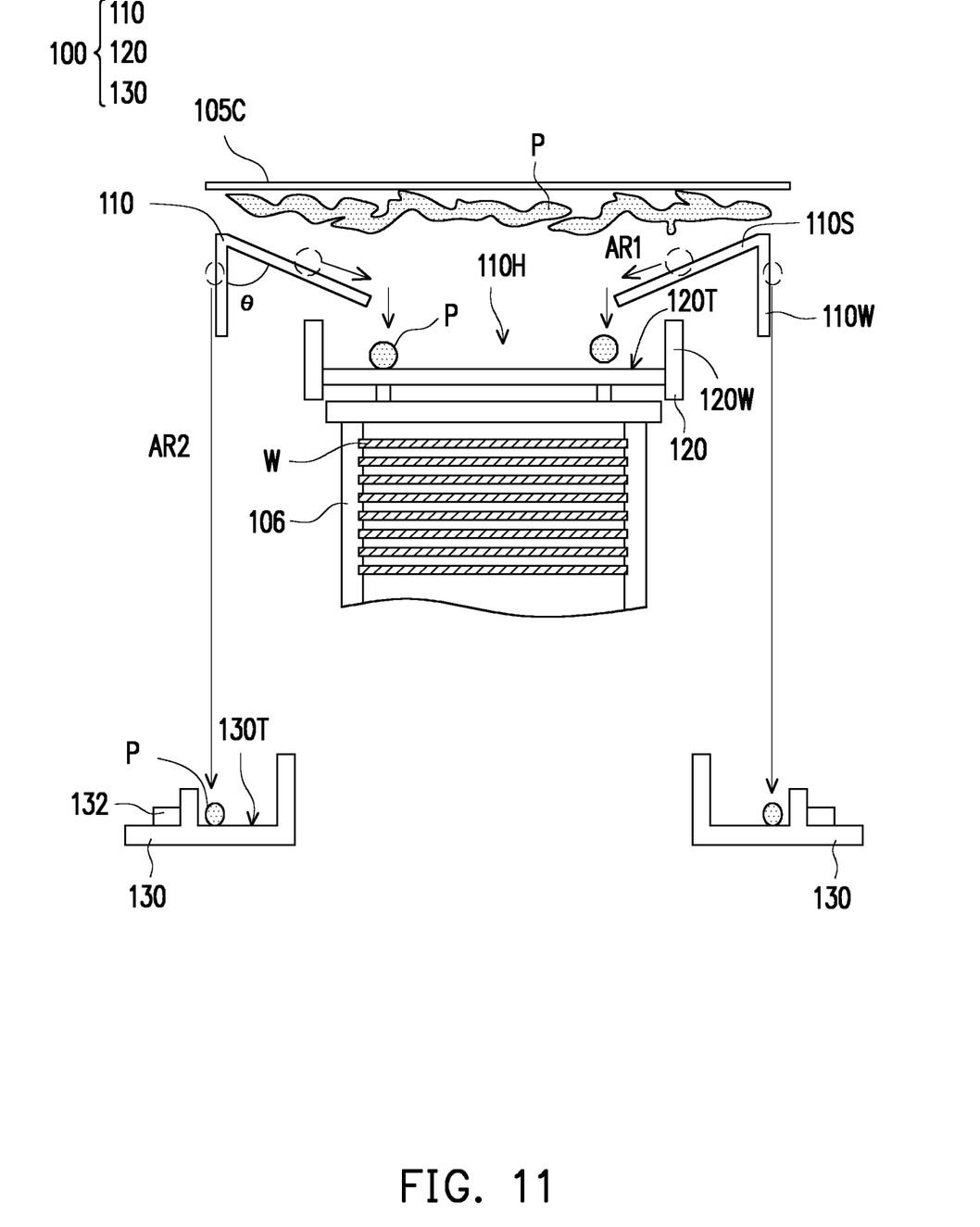
FIG. 11 is a schematic cross-sectional view illustrating a collecting module in a door-open state for collecting residues of curable dielectric material according to some embodiments.

FIG. 11 is a schematic cross-sectional view illustrating a collecting module in a door-open state for collecting residues of curable dielectric material according to some embodiments. It should be noted that the elements in FIG. 11 are illustrated in a simplified manner, and unless specified otherwise, like reference numbers are used to designate like elements throughout the drawings.

Referring to FIG. 11 and with reference to FIG. 1, when the residues of curable dielectric material P is formed in the chamber (e.g., on the ceiling 105C), the residues of curable dielectric material P may gather and tend to drip due to gravity. In order to collect the drips of the residues of curable dielectric material P, the flow-directing structure 110 including the slanted surface 110S may be placed below the ceiling 105C, and the tray 120 mounted on the wafer cassette 106 may be disposed below the flow-directing structure 110. As mentioned above, the included angle θ is between the slanted surface 110S and the outer sidewall 110W of the flow-directing structure 110 to facilitate the flow of the residues of curable dielectric material P along the slanted surface 110S. For example, the tray 120 is configured to pass through the hollow region 130H of the baffle structure 130 and be positioned to cover the hollow region 110H of the flow-directing structure 110. The tray 120 may be located at a position without physically contacting the flow-directing structure 110. For example, the sidewall 120W and the collecting surface 120T of the tray 120 are spatially apart from the outer sidewall 110W and the slated surface 110S of the flow-directing structure 110.

When the residues of curable dielectric material P dripping from the ceiling 105C, the flow-directing structure 110 may allow the residues of curable dielectric material P to flow along the slanted surface 110S toward the hollow region 110H as indicated by the arrow AR1. The residues of curable dielectric material P flowing from the slanted surface 110S of the flow-directing structure 110 may be eventually deposited on the collecting surface 120T of the tray 120 as indicated by the arrows, since the collecting surface 120T fully covers the hollow region 110H of the flow-directing structure 110. The tray 120 may shield the wafer cassette 106, so that the residues of curable dielectric material P may not drip onto the semiconductor wafers W held by the wafer cassette 106. In this manner, the wafer defects caused by dripping of the residues of curable dielectric material P may be eliminated.

In some embodiments, a portion of the residues of curable dielectric material P flowing along the outer sidewall 110W of the flow-directing structure 110 may be collected by the baffle structure 130. For example, the collecting surface 130T of the baffle structure 130 is right below the outer sidewall 110W of the flow-directing structure 110, so that the portion of the residues of curable dielectric material P flowing along the outer sidewall 110W may land on the collecting surface 130T of the baffle structure 130 as indicated by the arrow AR2. In this manner, the residues of curable dielectric material P may thoroughly collected by the collecting module 100.

Figure 12:
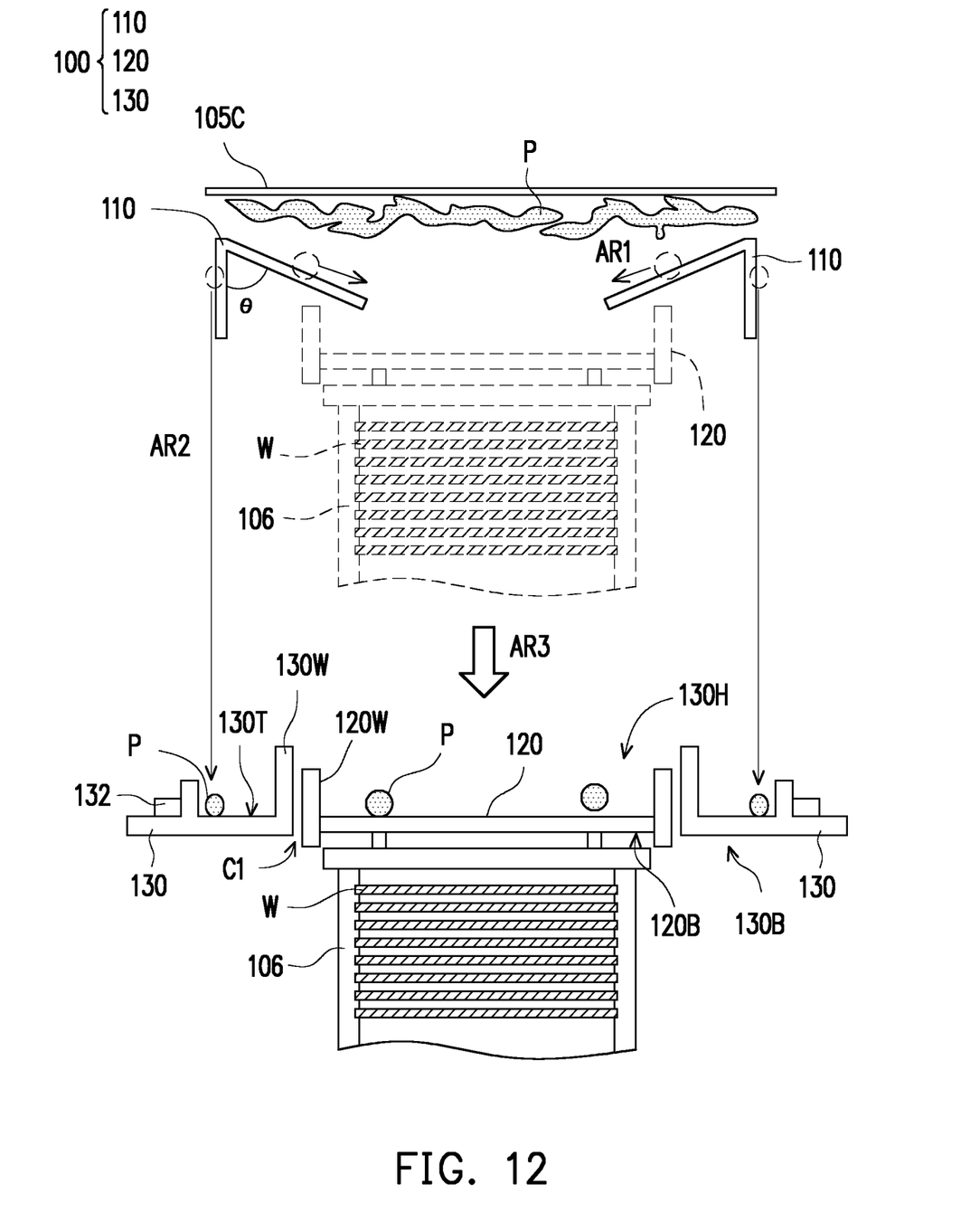
FIG. 12 is a schematic cross-sectional view illustrating a collecting module in a door-close state for collecting residues of curable dielectric material according to some embodiments.

FIG. 12 is a schematic cross-sectional view illustrating a collecting module in a door-close state for collecting residues of curable dielectric material according to some embodiments. The structure shown in FIG. 12 is similar to the structure shown in FIG. 11, unless specified otherwise, like reference numbers are used to designate like elements throughout the drawings.

Referring to FIG. 12 and with reference to FIG. 2, when changing from the door-close state to the door-open state, the wafer cassette 106 and the tray 120 mounted on the wafer cassette 106 may be moved from the upper position to the lower position as indicated by the arrow AR3. For example, in the door-open state, the tray 120 is positioned within the hollow region 130H of the baffle structure 130. In some embodiments, the bottom surface 120B of the tray 120 is substantially aligned with the bottom surface 130B of the baffle structure 130. Although due to positioning variations, the bottom surface 120B of the tray 120 may be higher (or lower) than the bottom surface 130B of the baffle structure 130, in accordance with some embodiments. The clearance C1 between the sidewall 120W of the tray 120 and the sidewall 130W of the baffle structure 130 may ensure the reciprocating movements of the tray 120 and the wafer cassette 106 without being interfered.

Figure 13:
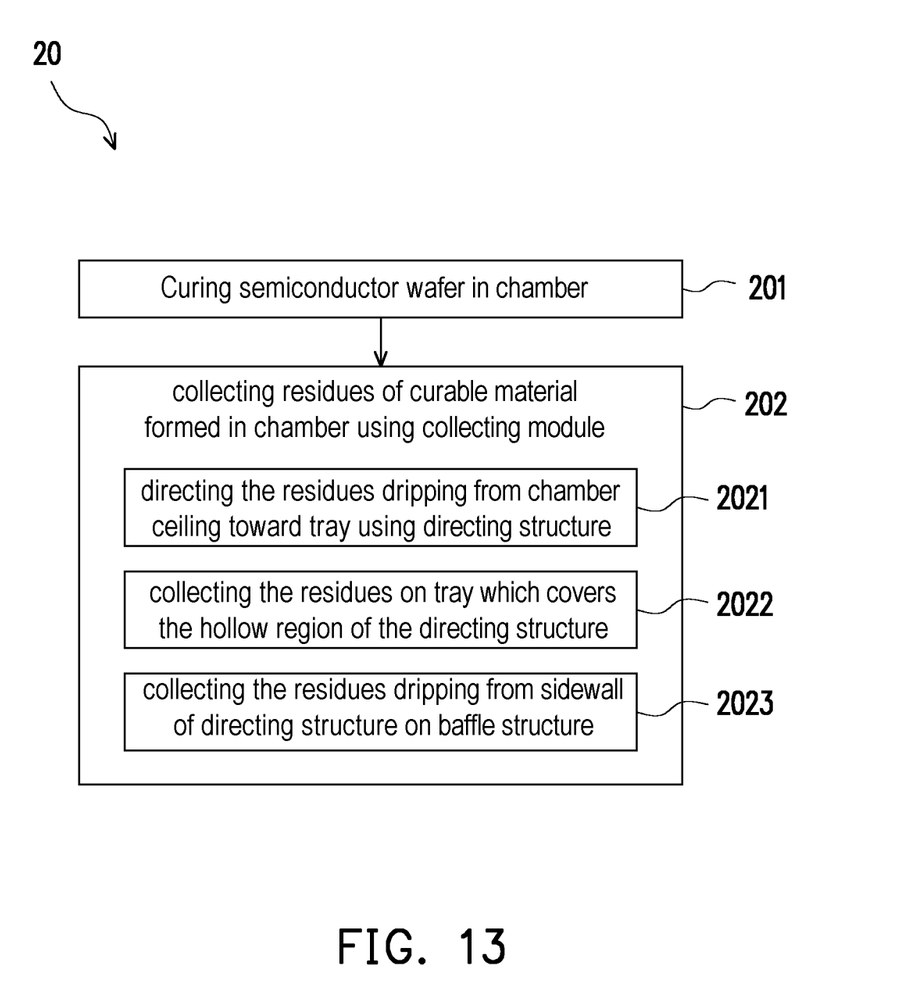
FIG. 13 is a flowchart of a method of collecting residues of curable dielectric material in a chamber according to some embodiments.

FIG. 13 is a flowchart of a method of collecting residues of curable dielectric material in a chamber according to some embodiments. It will be appreciated that although the method 20 is are illustrated and described below as a series of steps, the illustrated ordering of such steps are not to be interpreted in a limiting sense. For example, some steps occur in different orders and/or concurrently with other steps apart from those illustrated and/or described herein. In addition, not all illustrated steps may be required to implement one or more aspects or embodiments of the description herein. Further, one or more of the steps depicted herein may be carried out in one or more separate acts and/or phases.

Referring to FIG. 13, at the step 201, a curing process is performed to cure the semiconductor wafers in the chamber. For example, the chamber door is open and the semiconductor wafers to be processed are loaded onto the wafer cassette. Next, the chamber door is close, and the wafer cassette carrying the semiconductor wafers to be processed may be raised vertically to be positioned in the chamber. Subsequently, the thermal energy may be applied to cure the curable dielectric materials of the semiconductor wafers. As mentioned in preceding paragraphs, during the thermal curing, these curable dielectric materials may outgas when exposed to thermal energy. When the operation temperature in the chamber is lowering down, these gaseous species may condense on the ceiling of the chamber to form residues of curable dielectric material. FIGS. 1, 9, and 11 show some embodiments corresponding to the door-close state in the chamber.

At the step 202, the residues of the curable dielectric material are collected using the collecting module. For example, one portion of the residues of the curable dielectric material dripping from the ceiling of the chamber flows along the slanted surface of the flow-directing structure so as to be directed toward the hollow region of the flow-directing structure. The portion of the residues of the curable dielectric material may be collected on the collecting surface of the tray which fully covers the hollow region of the flow-directing structure. The other portion of the residues of the curable dielectric material dripping from the outer sidewall of the flow-directing structure may be collected on the collecting surface of the baffle structure. In this manner, the residues of the curable dielectric material formed in the chamber may be thoroughly collected by the collecting module, thereby preventing the residues of curable dielectric material from dripping onto the semiconductor wafers and causing wafer defects.

In some embodiments, after the curing process is finished, the semiconductor wafers that have been processed held by the wafer cassette are unloaded. For example, the wafer cassette carrying the semiconductor wafers that have been processed is lowered down, and the chamber door is open to unload the semiconductor wafers that have been processed. In some embodiments, the collecting module including the flow-directing structure, the tray, and the baffle structure may be disassembled for cleaning.

In accordance with some embodiments, a semiconductor apparatus includes a chamber containing a wafer cassette, and a collecting module disposed in the chamber for collecting residues of curable material in the chamber. The collecting module includes a flow-directing structure disposed below a ceiling of the chamber, a baffle structure disposed below the flow-directing structure, and a tray disposed on the wafer cassette. The flow-directing structure includes a first hollow region, the baffle structure includes a second hollow region, and the tray is moved together with the wafer cassette to pass through the second hollow region of the baffle structure and is positioned to cover the first hollow region of the flow-directing structure.

In accordance with some embodiments, a semiconductor apparatus includes a chamber containing a wafer cassette, and a collecting module disposed in the chamber for collecting residues of curable material. The collecting module includes a flow-directing structure mounted on an upper portion of the chamber, a baffle ring mounted on a lower portion of the chamber, and a tray shielding the wafer cassette. The flow-directing structure includes a central opening and a slanted surface sloped to direct the residues of curable material toward the central opening. The tray is movable together with the wafer cassette between the flow-directing structure and the baffle ring.

In accordance with some embodiments, a method includes at least the following steps. A curing process is performed on a semiconductor wafer in a chamber, where the semiconductor wafer is held by a wafer cassette and residues of curable material is formed in the chamber. The residues of curable material are collected by at least the following steps. A first portion of the residues of curable material dripping from a ceiling of the chamber is directed toward a tray using a flow-directing structure, where the flow-directing structure is mounted below the ceiling of the chamber, the flow-directing structure includes a central opening and a slanted surface sloped to direct the first portion of the residues of curable material toward the central opening. The first portion of the residues of curable material is collected on a collecting surface of the tray which covers the central opening of the flow-directing structure. A second portion of the residues of curable material dripping from an outer sidewall of the flow-directing structure is collected on a collecting surface of a baffle ring which is mounted on the chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor apparatus, comprising:
   a chamber containing a wafer cassette; and
   a collecting module disposed in the chamber for collecting residues of curable material in the chamber, and the collecting module comprising:
      a flow-directing structure disposed below a ceiling of the chamber and comprising a first hollow region;
      a baffle structure disposed below the flow-directing structure and comprising a second hollow region; and
      a tray disposed on the wafer cassette and being moved together with the wafer cassette to pass through the second hollow region of the baffle structure and be positioned to cover the first hollow region of the flow-directing structure.

2. The semiconductor apparatus of claim 1, wherein the flow-directing structure comprises a slanted surface having a slope toward the first hollow region to direct the residues of curable material toward the tray.

3. The semiconductor apparatus of claim 1, wherein the tray comprises a collecting surface facing the flow-directing structure, and a maximum lateral dimension of the collecting surface of the tray is greater than a maximum lateral dimension of the first hollow region of the flow-directing structure.

4. The semiconductor apparatus of claim 1, wherein a maximum lateral dimension of the baffle structure is greater than a maximum lateral dimension of the flow-directing structure.

5. The semiconductor apparatus of claim 4, wherein the baffle structure comprises a collecting surface encircling the second hollow region and below an outer sidewall of the flow-directing structure to collect the residues of curable material dripping from the outer sidewall of the flow-directing structure.

6. The semiconductor apparatus of claim 1, wherein a maximum lateral dimension of the second hollow region of the baffle structure is greater than a maximum lateral dimension of the tray.

7. The semiconductor apparatus of claim 1, wherein the tray comprises a bottom surface facing the wafer cassette, and a sidewall extension extending around the bottom surface.

8. The semiconductor apparatus of claim 1, wherein the tray comprises a maximum lateral dimension greater than the wafer cassette to shield the wafer cassette.

9. The semiconductor apparatus of claim 1, wherein a shape of the tray is substantially complementary to that of the second hollow region of the baffle structure.

10. A semiconductor apparatus, comprising:
    a chamber containing a wafer cassette; and
    a collecting module disposed in the chamber for collecting residues of curable material, and the collecting module comprising:
       a flow-directing structure mounted on an upper portion of the chamber, the flow-directing structure comprising a central opening and a slanted surface sloped to direct the residues of curable material toward the central opening;
       a baffle ring mounted on a lower portion of the chamber; and a tray shielding the wafer cassette and being movable together with the wafer cassette between the flow-directing structure and the baffle ring.

11. The semiconductor apparatus of claim 10, wherein the tray comprises a collecting surface facing the flow-directing structure and covering the central opening of the flow-directing structure.

12. The semiconductor apparatus of claim 10, wherein the baffle ring is wider than the flow-directing structure, an outer sidewall of the flow-directing structure is above a collecting surface of the baffle ring.

13. The semiconductor apparatus of claim 10, wherein the baffle ring is wider than the tray to allow the wafer cassette and the tray mounted on the wafer cassette to pass through the baffle ring.

14. The semiconductor apparatus of claim 10, wherein the tray mounted on the wafer cassette comprises a bottom surface and a sidewall extension extending around the bottom surface.

15. The semiconductor apparatus of claim 10, wherein the tray comprises a shape substantially matching a complementary shape of the central opening of the baffle structure.

16. A semiconductor apparatus, comprising:
a chamber containing a wafer cassette; and
a collecting module disposed in the chamber and comprising:
a flow-directing structure disposed at a top side of the chamber, the flow-directing structure comprising a hollow region and a slanted surface, the slanted surface directing residues of curable material toward the hollow region;
a tray disposed on the wafer cassette, the tray receiving the residues of the curable material dripping from the flow-directing structure; and
a baffle ring disposed at a bottom side of the chamber.

17. The semiconductor apparatus of claim 16, wherein the baffle ring is wider than the tray to allow the wafer cassette and the tray to pass through the baffle ring.

18. The semiconductor apparatus of claim 16, wherein the tray comprises a collecting surface for receiving the residues of the curable material, and a maximum lateral dimension of the collecting surface of the tray is greater than a maximum lateral dimension of the hollow region of the flow-directing structure.

19. The semiconductor apparatus of claim 16, wherein a maximum lateral dimension of the baffle ring is greater than a maximum lateral dimension of the flow-directing structure.

20. The semiconductor apparatus of claim 16, wherein the tray comprises a bottom surface and a sidewall extension, the bottom surface faces the wafer cassette, and the sidewall extension is disposed along a boundary of the bottom surface and extends toward the wafer cassette.

* * * * *